(12) United States Patent
Omura

(10) Patent No.: US 8,410,464 B2
(45) Date of Patent: Apr. 2, 2013

(54) OPTICAL COUPLER HAVING FIRST AND SECOND TERMINAL BOARDS AND FIRST AND SECOND CONVERSION ELEMENTS

(75) Inventor: Eiichi Omura, Nara (JP)

(73) Assignee: OMRON Corporation, Kyoto (JP)

( * ) Notice: Subject to any disclaimer, the term of this patent is extended or adjusted under 35 U.S.C. 154(b) by 487 days.

(21) Appl. No.: 12/713,026

(22) Filed: Feb. 25, 2010

(65) Prior Publication Data
US 2010/0270483 A1 Oct. 28, 2010

(30) Foreign Application Priority Data
Apr. 23, 2009 (JP) ................... 2009-105552

(51) Int. Cl.
*G02B 27/00* (2006.01)
(52) U.S. Cl. ....................................... 250/551
(58) Field of Classification Search ............... 250/551; 257/80–85, 90–100; 385/92, 94
See application file for complete search history.

(56) References Cited

U.S. PATENT DOCUMENTS

| | | | |
|---|---|---|---|
| 4,054,801 A | 10/1977 | Breval et al. | |
| 5,391,868 A | 2/1995 | Vampola et al. | |
| 5,514,996 A * | 5/1996 | Aizawa | 327/514 |
| 5,629,534 A | 5/1997 | Inuzuka et al. | |
| 6,590,232 B2 * | 7/2003 | Matsuo | 257/82 |
| 2002/0025593 A1 | 2/2002 | Matsuo | |
| 2008/0187013 A1 | 8/2008 | Guenter et al. | |
| 2009/0044852 A1 | 2/2009 | Shadbolt et al. | |

FOREIGN PATENT DOCUMENTS

| | | |
|---|---|---|
| JP | 05-218491 A | 8/1993 |
| JP | 05-308151 A | 11/1993 |
| JP | 3026396 B2 | 1/2000 |
| JP | 3725410 B2 | 9/2005 |

OTHER PUBLICATIONS

European Search Report for European Application No. 10153815.5-2415 dated Oct. 12, 2010, 6 pages.

* cited by examiner

*Primary Examiner* — Thanh Luu
(74) *Attorney, Agent, or Firm* — Osha Liang LLP

(57) ABSTRACT

An optical coupler has a first terminal board and a second terminal board, a first conversion element for converting an electrical signal into an optical signal mounted on a surface of a first element mounting section of the first terminal board, a second conversion element for converting an optical signal into an electrical signal mounted on a surface of a second element mounting section of the second terminal board; and a light reflective curved surface formed so as to cover the first conversion element and the second conversion element. The surfaces of the first element mounting section and the second element mounting section have the same orientation. An optical signal emitted from the first conversion element is reflected on the light reflective curved surface, to optically couple the first conversion element and the second conversion element. The second conversion element has a plurality of light receiving cells that are electrically connected in series, arrayed in parallel with one another, and longer in a longitudinal direction than in a width direction. The first conversion element is arranged inside an area sandwiched between two contact lines that are set so as to be in contact with an outline of the second conversion element, and are in parallel with a length direction of the light receiving cells.

4 Claims, 16 Drawing Sheets

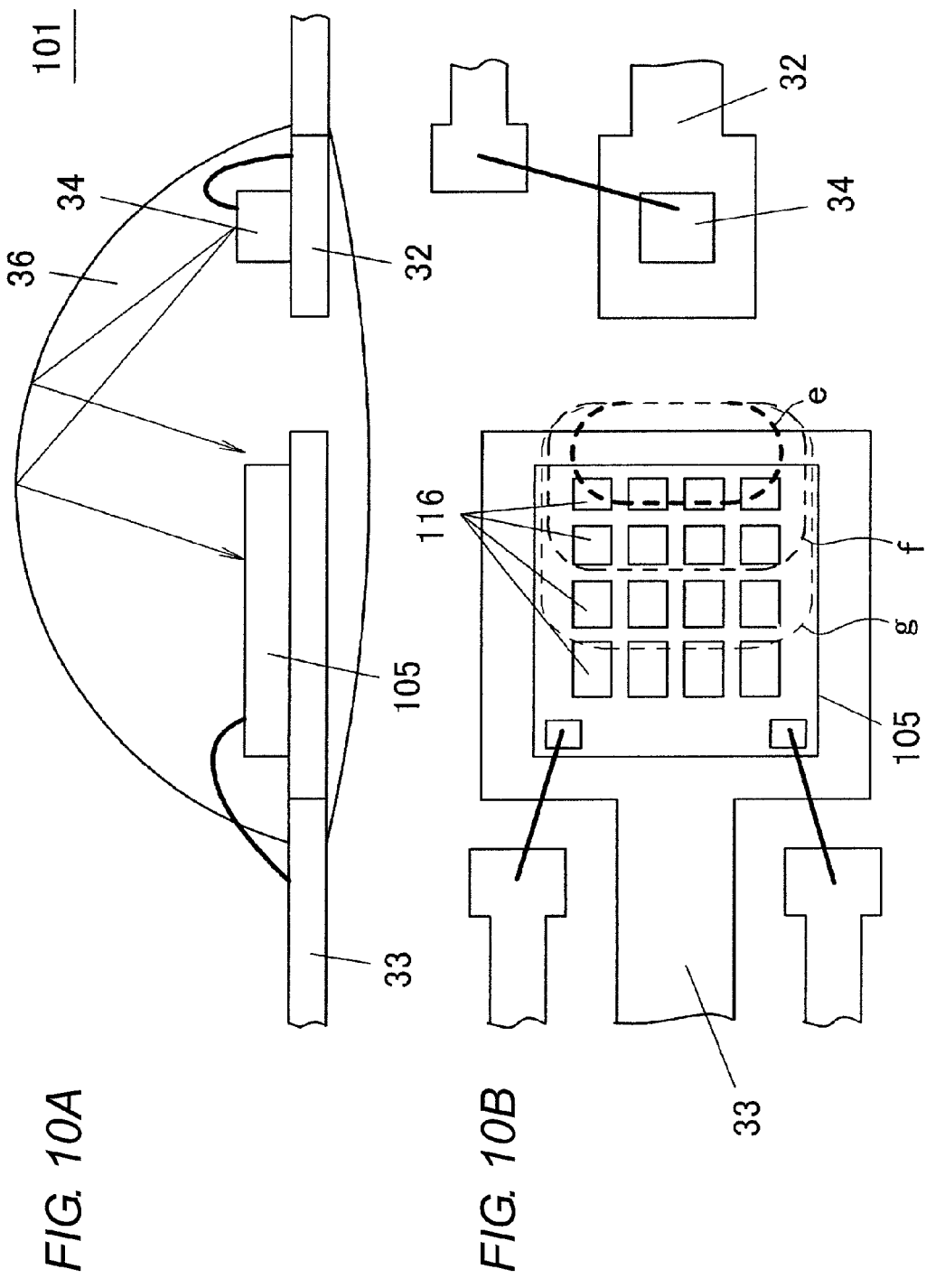

OPTICAL COUPLER HAVING FIRST AND SECOND TERMINAL BOARDS AND FIRST AND SECOND CONVERSION ELEMENTS

TECHNICAL FIELD

The present invention relates to an optical coupler that electrically couples one terminal with the other terminal through an optical signal. Specifically, the present invention relates to an optical coupler for converting an input electrical signal into an optical signal and further converting the optical signal into an output electrical signal, thereby to electrically couple an input and an output while holding insulation therebetween.

RELATED ART (Two Types of Optical Couplers)

FIGS. 1 and 2 show two types of optical couplers. FIG. 1 is a sectional view of an opposed type optical coupler, and FIG. 2 shows a sectional view of a juxtaposed type optical coupler.

An opposed type optical coupler 11 shown in FIG. 1 is structured such that a light emitting element 14 and a light receiving element 15 mounted on lead frames 12, 13 are vertically opposed to each other, a space between the light emitting element 14 and the light receiving element 15 is sealed with a transparent resin 16, and further, the outside of the transparent resin 16 is sealed with a sealing resin 17. An input electrical signal is converted by the light emitting element 14 into an optical signal, and the optical signal launched from the light emitting element 14 is made incident on the light receiving element 15, to optically couple the light emitting element 14 and the light receiving element 15, and the optical signal is converted by the light receiving element 15 into an output electrical signal. With such a structure, it is possible to transmit an electrical signal from the lead frame 12 on the input side to the lead frame 13 on the output side while providing electrical insulation between the lead frames 12 and 13.

In the opposed type optical coupler 11, since an optical signal launched from the light emitting element 14 transmits inside the transparent resin 16 to be directly incident on the light receiving element 15, there is an advantage in high optical coupling efficiency between the light emitting element 14 and the light receiving element 15. However, on the other hand, since the lead frame 12 mounted with the light emitting element 14 and the lead frame 13 mounted with the light receiving element 15 are vertically opposed to each other to form a three-dimensional structure, there is high manufacturing cost.

In a juxtaposed type optical coupler 21 shown in FIG. 2, a light emitting element 24 and a light receiving element 25 are respectively mounted on the surfaces of the same orientation in the respective top sections of lead frames 22, 23, a transparent resin 26 is formed in dome shape so as to cover the light emitting element 24 and the light receiving element 25, and further, the outside of the transparent resin 26 is sealed with a sealing resin 27. An input electrical signal is then converted by the light emitting element 24 into an optical signal, and the optical signal launched from the light emitting element 24 is reflected on an interface of the transparent resin 26 and the sealing resin 27, and made incident on the light receiving element 25, to optically couple the light emitting element 24 and the light receiving element 25, and the optical signal is converted by the light receiving element 25 into an output electrical signal. Also with such a structure, it is possible to transmit an electrical signal from the lead frame 22 on the input side to the lead frame 23 on the output side while providing electrical insulation between the lead frames 22 and 23.

In such a juxtaposed type optical coupler 21, since an optical signal launched from the light emitting element 24 is reflected on the interface of the transparent resin 26 and guided to the light receiving element 25, optical coupling efficiency between the light emitting element 24 and the light receiving element 25 tends to decrease due to leakage or absorption of the optical signal on the interface of the transparent resin 26. However, in the juxtaposed type optical coupler 21, since the light emitting element 24 and the light receiving element 25 are arranged on the surfaces of the same orientation in the top sections (element mounting portions) of the lead frames 22, 23, there is an advantage in that die-bonding of the light emitting element 24 and the light receiving element 25 to the lead frames 22, 23, connection of bonding wires 28, 29, and the like are easy to perform, so as to make manufacturing cost low.

(Enhancement of Photoelectromotive Force and Improvement in Photocurrent)

Next described is a structure generally in use for enhancing photoelectromotive force of an optical coupler. A light receiving element of the optical coupler is rarely formed of a single light receiving cell, but normally formed by aligning a plurality of light receiving cells to form a light receiving area and connecting each of the light receiving cells in series. With such a structure, electromotive force as a whole is a total of electromotive force of the individual light receiving cells, and hence large electromotive force can be obtained.

However, in the case of connecting a plurality of light receiving cells in series, photocurrents generated in the respective light receiving cells need to be made uniform. This is because a photocurrent flowing throughout the light receiving cells connected in series is restricted by the smallest photocurrent among the plurality of light receiving cells.

Therefore, in order to increase a photocurrent flowing through the light receiving element at the time of light reception to bring the efficiency of the optical coupler into an optimal condition, photocurrents generated in the respective light receiving cells need to be made uniform, which requires equalization of amounts of light received in the respective light receiving cells. As a method for equalizing amounts of light received in the respective light receiving elements, a method for optimizing areas of the light receiving cells is employed.

In the opposed type optical coupler 11, it is common that, as shown in FIG. 3A, sixteen light receiving cells "a", "b" and "c" are arranged in matrix form to form the light receiving element 15, and an area of the light receiving cell "a" at the midsection is made smaller while an area of the light receiving cell "c" at the peripheral section is made larger. Japanese Unexamined Patent Publication No. 3026396 describes such a structure. Since an optical intensity is generally proportional to a square of a distance, making the area of the light receiving cell smaller at the midsection and larger at the peripheral section can lead to uniformity of amounts of light received in the respective light receiving cells, thereby increasing the photocurrent to enhance the efficiency of the optical coupler.

Further, in the optical coupler 11 disclosed in Japanese Unexamined Patent Publication No. 3026396, as shown in FIG. 3B, the area of the light receiving cell "a" at the midsection is made larger while the area of the light receiving cell "c" at the peripheral section is made smaller. This is performed in consideration of optical signals that are reflected on the interface of the transparent resin 16 and the sealing resin 17 and incident on the light receiving cells "a", "b" and "c".

On the other hand, in the case of the juxtaposed type optical coupler 21, the areas of the light receiving cells are not optimized, but as shown in FIG. 3c, light receiving cells A having the same area are arranged in matrix form, to form the light receiving element 25. Therefore, an amount of light received in the light receiving cell A closer to the light emitting element 24 is larger while an amount of light received in the light receiving cell A farther from the light emitting element 24 is smaller, whereby variations in amount of light received in the respective light receiving cells A are large, and variations in photocurrent generated in the respective light receiving cells A are large.

Further, in the case of the juxtaposed type optical coupler 21, a resin in a molten state is dropped in between the light emitting element 24 and the light receiving element 25, and the resin is then cured to form the transparent resin 26. However, variations in viscosity and amount of this resin dropped tend to cause variations in height and shape (namely, reflected surface shape) of the transparent resin 26. This leads to changes in optical intensity distribution and light amount of an optical signal reflected on the transparent resin 26 and then applied to the light receiving element 25, thereby bringing about variations in photocurrent and fluctuations in photo-electromotive force. It is to be noted that this aspect is specifically described later in Comparative Example 2.

(Other Related Arts)

As the method for making amounts of light received in the light receiving cells in the juxtaposed type optical coupler uniform, there have been proposed a variety of methods each with a contrived reflected surface shape. For instance, in the optical coupler disclosed in Japanese Unexamined Patent Publication No. 3725410, a projecting section having a triangular cross section is provided on the top surface of the transparent resin. Further, in an optical coupler disclosed in Japanese Unexamined Patent Publication No. H5-218491, the surface of a transparent resin is formed into elliptical shape, a reflection film is formed on the periphery thereof, and a light emitting element and a light receiving element are arranged on foci of the ellipse. In an optical coupler disclosed in Japanese Unexamined Patent Publication No. H5-308151, a lens surface in the shape of a Fresnel lens is formed on the top surface of a transparent resin.

However, any of the methods as disclosed in Japanese Unexamined Patent Publication No. 3725410, Japanese Unexamined Patent Publication No. H5-218491 and Japanese Unexamined Patent Publication No. H5-308151 has a disadvantage that, since the surface shape of the of the transparent resin needs to be controlled with accuracy, manufacturing cost of the optical coupler is high, thereby preventing the merit of the juxtaposed type optical coupler from being used to good effect.

Although an effective method capable of increasing a photocurrent generated in the light receiving element in the juxtaposed type optical coupler as described above has not been established, since the juxtaposed type optical coupler has excellent merits of being easy to manufacture and being able to be reduced in manufacturing cost, there has been a strong demand for a method for increasing a photocurrent without inducing a cost increase.

SUMMARY

According to one or more embodiments of the present invention, a juxtaposed type optical coupler, manufacturing cost of which is low as compared with that of an opposed type optical coupler, has high values of photoelectromotive force and a photocurrent, to give favorable output efficiency.

In accordance with one aspect of the present invention, there is provided an optical coupler, in which a first conversion element for converting an electrical signal into an optical signal and a second conversion element for converting an optical signal into an electrical signal are mounted on the surfaces of the same orientation in element mounting sections of respective terminal boards, a light reflective curved surface is formed so as to cover the first conversion element and the second conversion element, and an optical signal emitted from the first conversion element is reflected on the light reflective curved surface; to optically couple the first conversion element and the second conversion element, wherein the second conversion element has a plurality of light receiving cells that are electrically connected in series, arrayed in parallel with one another, and long in one direction, and the first conversion element is arranged inside an area sandwiched between two contact lines that are set so as to be in contact with an outline of the second conversion element, and are in parallel with a length direction of the light receiving cells.

In the optical coupler according to one or more embodiments of the present invention, even when a distance between the first conversion element and the second conversion element varies or a shape of the light reflective curved surface varies to cause displacement of a position irradiated with the optical signal that is incident on the second conversion element, the optical signal can be made incident almost uniformly on each of the light receiving cells, and also, an amount of light received in each of the light receiving cells can be held almost unchanged. Therefore, not only electromotive force and an output current (photocurrent) generated in the second conversion element can be made larger, but also the electromotive force and the output current become stable so that output characteristics of the optical coupler can be stabilized.

In the optical coupler according to the one aspect of the present embodiment, among the light receiving cells arrayed in parallel with one another, the light receiving cell located at the midsection has a narrower width and the light receiving cell located at the end has a wider width. When the first conversion element is located on the central line passing through the center of a width direction of the second conversion element or in the vicinity of the central line, optical intensity may be higher in the light receiving cell at the midsection and optical intensity is lower in the light receiving cell at the end, but in such a case, a width of the light receiving cell located at the midsection is narrowed and a width of the light receiving cell located at the end is widened so that the amount of light received in each light receiving cell can be made uniform, thereby to further enhance the output characteristics of the optical coupler.

In accordance with another aspect of the present invention, there is provided a photoelectric conversion element, including: a plurality of light receiving cells that are long in one direction; and two pads, wherein the light receiving cells are electrically connected in series and arrayed in parallel with one another, and the two pads are along with a side orthogonal to the length direction of the light receiving cells that are electrically connected respectively to both ends of the light receiving cells connected in series, and arrayed in parallel with one another. This photoelectric conversion element (light receiving cell array) can be used as the second conversion element in the optical coupler according to one or more embodiments of the present invention, and the pads can be arranged so as to be located at the farther end from the first conversion element, whereby wiring of bonding wires is not complicated in connecting the wires to the pads, an optical signal from the first conversion element is not apt to be blocked by the wires, and the light reflective curved surface is not apt to warp due to the influence of the wires in forming the light reflective curved surface on the surface of the transparent resin or the like.

In accordance with still another aspect of the present invention, there is provided a MOS driver, wherein in an optical coupler in which a first conversion element for converting an electrical signal into an optical signal and a second conversion element for converting an optical signal into an electrical signal are mounted on the surfaces of the same orientation in element mounting sections of respective terminal boards, a light reflective curved surface is formed so as to cover the first conversion element and the second conversion element, and an optical signal emitted from the first conversion element is reflected on the light reflective curved surface, to optically couple the first conversion element and the second conversion element, the second conversion element has a plurality of light receiving cells that are electrically connected in series, arrayed in parallel with one another, and long in one direction, the first conversion element is arranged inside an area sandwiched between two contact lines that are set so as to be in contact with an outline of the second conversion element, and are in parallel with a length direction of the light receiving cells, and a control circuit for driving a MOSFET is connected in parallel with the second conversion element.

In accordance with still another aspect of the present invention, there is provided a semiconductor relay, wherein in an optical coupler in which a first conversion element for converting an electrical signal into an optical signal and a second conversion element for converting an optical signal into an electrical signal are mounted on the surfaces of the same orientation in element mounting sections of respective terminal boards, a light reflective curved surface is formed so as to cover the first conversion element and the second conversion element, and an optical signal emitted from the first conversion element is reflected on the light reflective curved surface, to optically couple the first conversion element and the second conversion element, the second conversion element has a plurality of light receiving cells that are electrically connected in series, arrayed in parallel with one another, and long in one direction, the first conversion element is arranged inside an area sandwiched between two contact lines that are set so as to be in contact with an outline of the second conversion element, and are in parallel with a length direction of the light receiving cells, a control circuit for driving a MOSFET is connected in parallel with the second conversion element, and MOSFETs are respectively connected to both ends of the connection circuit.

The MOS driver and the semiconductor relay can be produced through use of the structure of the optical coupler according to one or more embodiments of the present invention, thus exerting similar action effects to that of the optical coupler according to one or more embodiments of the present invention. Further, since the control circuit and the MOSFETs can be integrally formed, the MOS driver and the semiconductor relay can be reduced in size.

BRIEF DESCRIPTION OF THE DRAWINGS

FIG. 10A is a sectional view showing an optical coupler of Comparative Example 2,
and FIG. 10B is a plan view showing arrangement of a light emitting element and light receiving element thereof and a configuration of light receiving cells.

DETAILED DESCRIPTION

Figure 4:
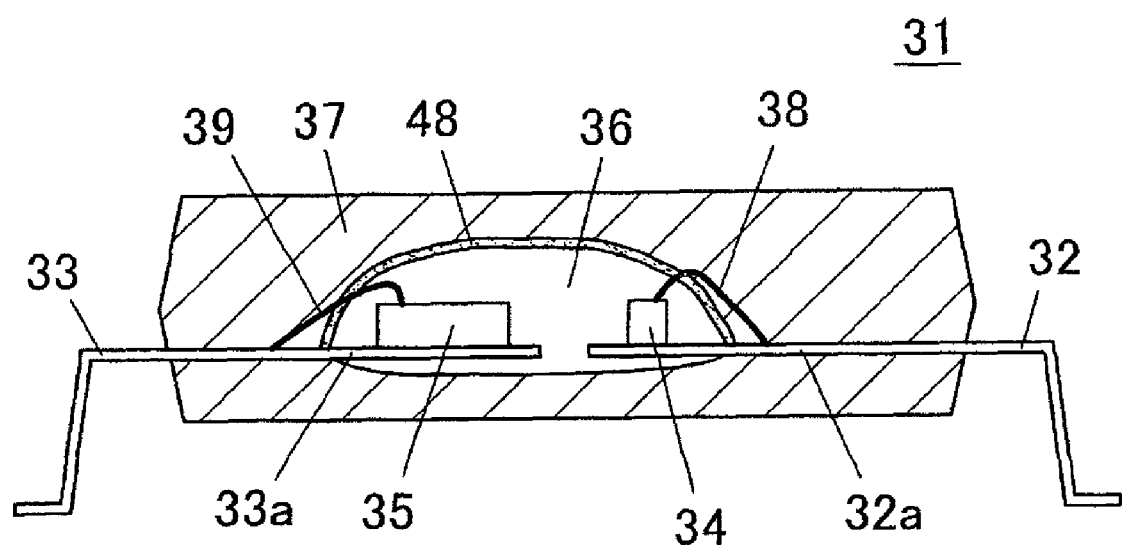
FIG. 4 is a sectional view of an optical coupler in accordance with a first embodiment of the present invention.
Figure 5:
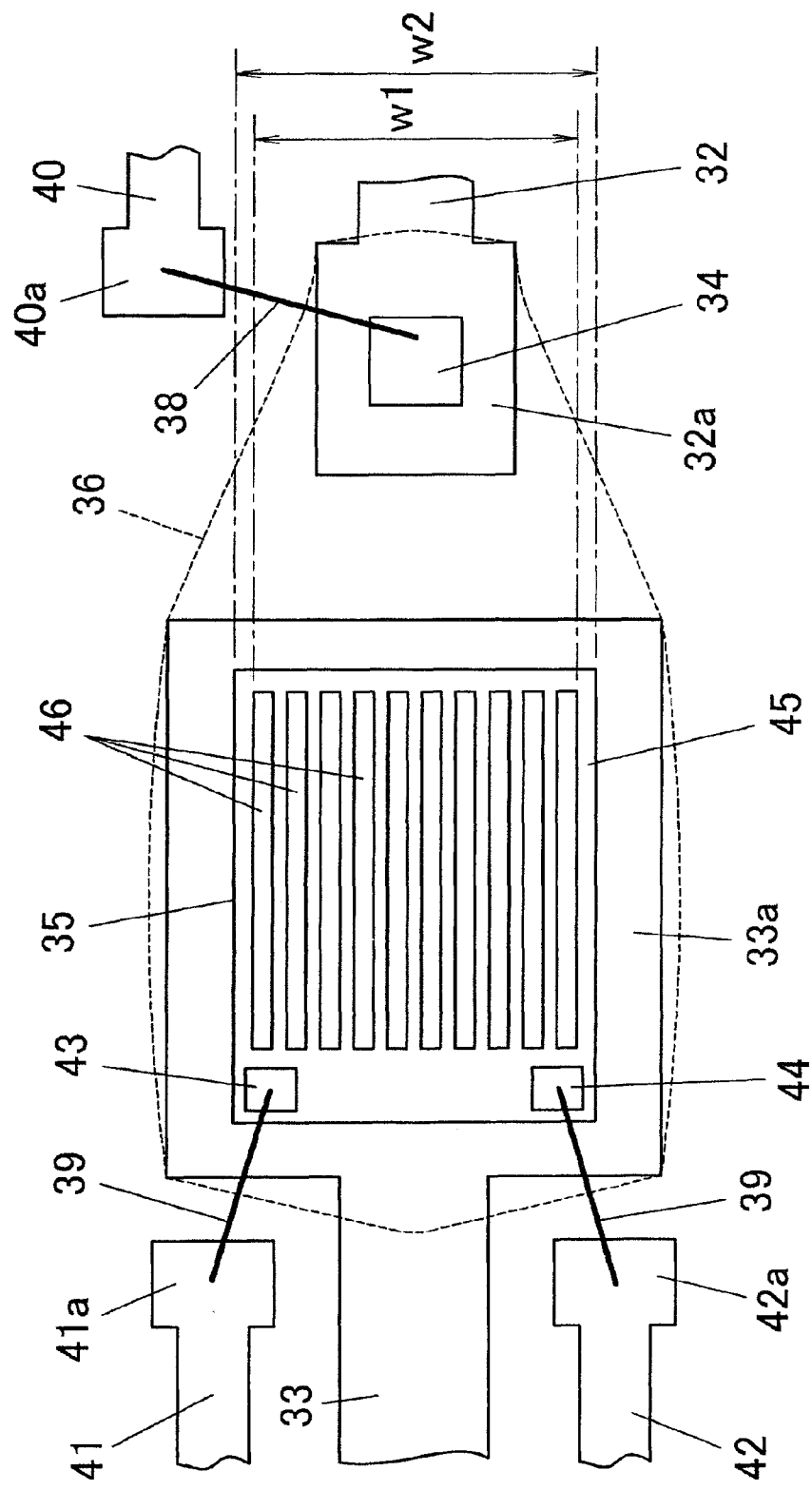
FIG. 5 is a plan view showing a light emitting element and a light receiving element mounted on lead frames in the same optical coupler as above.

Hereinafter, preferred embodiments of the present invention will be described with reference to the drawings. However, the present invention is not restricted to the following embodiments, and a variety of design changes can be made within a range not deviating from the gist of the present invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.
(First Embodiment)
First, a structure of an optical coupler 31 of a first embodiment of the present invention will be described. FIG. 4 is a sectional view showing a structure of the optical coupler 31 in accordance with the first embodiment. FIG. 5 is a plan view showing a light emitting element 34 (first conversion element) and a light receiving element 35 (second conversion element) which are mounted on element mounting sections 32a, 33a of lead frames 32, 33 inside the optical coupler 31.

As shown in FIG. 5, the optical coupler 31 includes: the lead frame 32 (terminal board) for die-bonding of the light emitting element 34 to the element mounting section 32a; the lead frame 33 (terminal board) for die-bonding of the light receiving element 35; a lead frame 40 for wire-bonding between a wiring section 40a and the light emitting element 34; and lead frames 41, 42 for wire-bonding between wiring sections 41a, 42a and the light receiving element 35. Any of the respective element mounting sections 32a, 33a of the lead frames 32, 33 and the respective wiring sections 40a, 41a, 42a of the lead frames 40, 41, 42 is formed in flat shape, and arranged almost on the same plane inside a sealing resin 37. Further, any of the lead frames 32, 33, 40 to 42 is bent in a shape suitable for mounting on a print circuit board or the like in the outside of the sealing resin 37.

The lead frames 32, 33 are produced of a metal material such as copper, iron or 42 alloy, and the surfaces thereof are plated. On each of the lead frames 32, 33, 40 to 42, a portion (inner lead) sealed inside the sealing resin 37 is provided three-layer plating made up of silver or nickel (lower layer), palladium (intermediate layer), and gold (upper layer) for enhancement in wire-bonding properties. Further, a portion (outer lead) outside the sealing resin 37 is provided two-layer plating made up of solder plating or silver (lower layer) and lead free plating (upper layer) for mounting by means of soldering or the like.

The element mounting section 32a of the lead frame 32 is mounted with the light emitting element 34 by die-bonding. In the light emitting element 34, the surface (top surface) opposite to the die-bonding surface is a light-launching surface. Further, the light emitting element 34 is electrically wired with the wiring section 40a of the lead frame 40 through a bonding wire 38 made of a gold wire, an aluminum wire or a copper wire (normally, the gold wire is used).

The light emitting element 34 is an element for converting an electrical signal into an optical signal, and a light emitting diode (LED) is mainly used. For instance, an ALGaAs type LED, a GaAs/GaAs type LED, a GaAlAs/GaAlAs/GaAs type LED or the like can be used, but a peak of a light emitting wavelength differs depending upon the material, and hence a suitable one may be selected in view of a peak sensitivity wavelength or component cost.

The element mounting section 33a of the lead frame 33 is mounted with the light receiving element 35 by die-bonding. The light receiving element 35 is an element for converting an optical signal into an electrical signal, mainly formed of a photodiode array, and formed with light receiving areas on the die-bonding surface and the opposite surface (top surface). Further, wiring bond pads 43, 44 of the light receiving element 35 are electrically connected with the wiring sections 41a, 42a of the lead frames 41, 42 through bonding wires 39 each made of a gold wire, an aluminum wire or a copper wire (normally, the gold wire is used).

The light receiving element 35 is one provided with a plurality of light receiving cells 46 on the top surface of a substrate 45. The light receiving cells 46 are an area for converting an optical signal into an electrical signal, namely an area for receiving an optical signal to generate photoelectromotive force. The light receiving cell 46 is mainly formed of a photodiode, and in that case, the light receiving element 35 is a photodiode array. Each of the light receiving cells 46 has a rectangular or strip shape that is long in one direction as seen from the top surface, and has an equivalent width and length. Each of the light receiving cells 46 is arrayed in parallel with one another at a fixed pitch, and connected in series with one another.

The positional relation (arrangement) of the light emitting element 34 and the light receiving element 35 will be described below: the light emitting element 34 and the light receiving element 35 are mounted on the surface of the same orientation in the element mounting section 32a and the element mounting section 33a (namely, the top surfaces of the element mounting sections of both elements), and the optical coupler 31 is a juxtaposed type optical coupler.

Further, the light emitting element 34 is located in a length direction of the light receiving cell 46 with respect to the light receiving element 35. To be precise, the light emitting element 34 is arranged in an area sandwiched between two contact lines in parallel with the length direction of the light receiving cells 46 and in contact with an outline of the light receiving element 35 (when described based upon FIG. 5, those are lines extended from the side surfaces of the light receiving element 35 as seen from the top surface side), namely in an area indicated with w2 in FIG. 5. More preferably, the light emitting element 34 is arranged in an area sandwiched between lines extended from the edges of the light receiving area where the plurality of light receiving cells 46 are arranged (lines extended from the external edges of the light receiving cells 46 at the ends), namely in an area indicated with w1 of FIG. 5. In a typical arrangement, as shown in FIG. 5, a line segment connecting the center of the light receiving area of the light receiving element 35 and the center of the light emitting element 34 is in parallel with the length direction of the light receiving cells 46.

Figure 6:
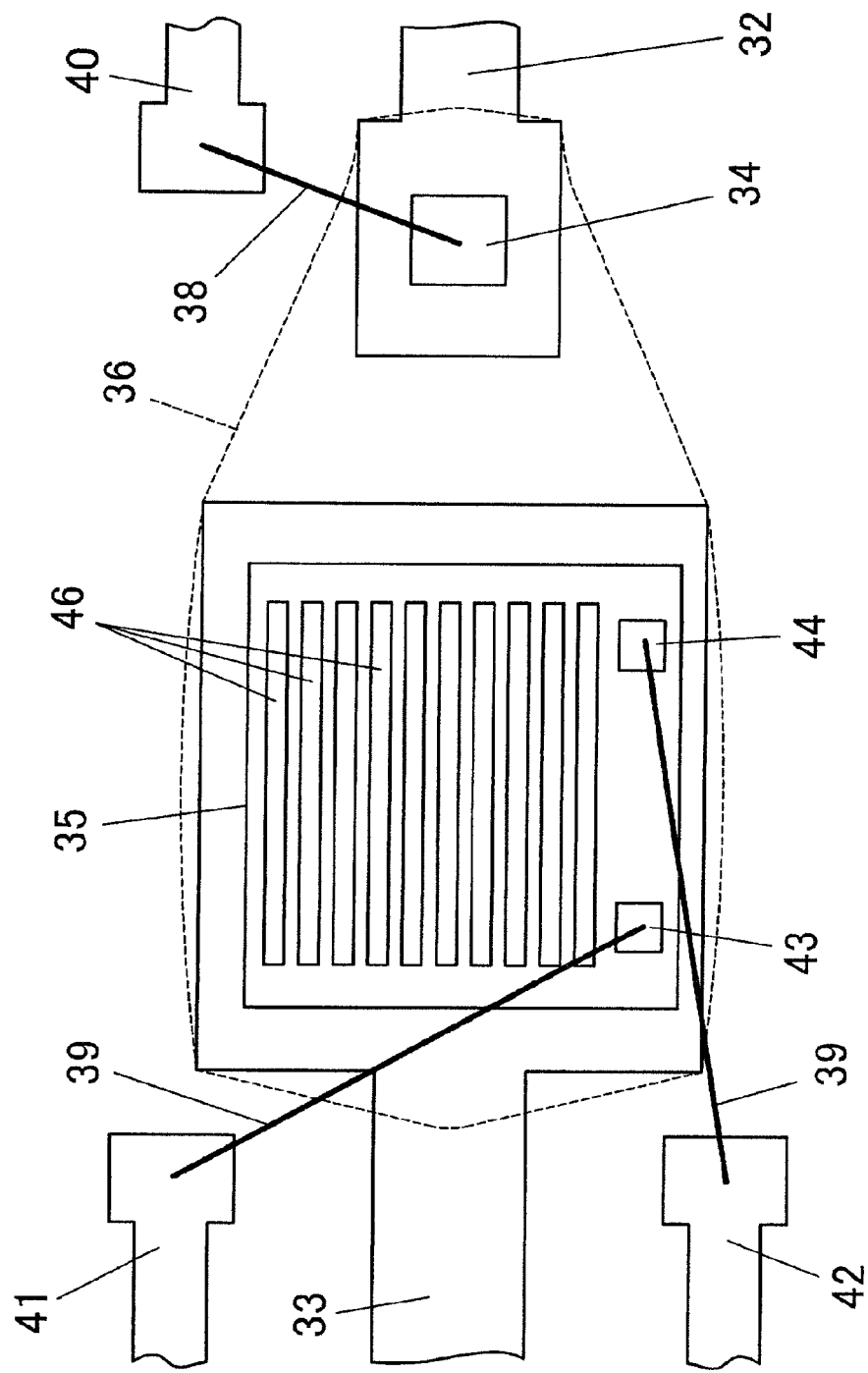
FIG. 6 is a schematic plan view showing Comparative Example 1.

Further, the wiring bond pads 43, 44 are provided outside the light receiving area, along with a side orthogonal to the length direction of the light receiving cells 46, and the light receiving element 35 is die-bonded to the lead frame 33 such that the wiring bond pads 43, 44 are located on the farther side from the light emitting element 34. Although it is possible to arrange the wiring bond pads 43, 44 on the side of the light receiving area as in Comparative Example 1 shown in FIG. 6, in such a form, wiring of a bonding wire 39 becomes complicated, and hence the bonding wire 39 blocks an optical signal or has an influence upon a dome shape of a transparent resin 36. Therefore, the wiring pads 43, 44 are preferably located on the farther side from the light emitting element 34 as in FIG. 5.

As shown in FIG. 4, the light emitting element 34 mounted on the element mounting section 32a and the light receiving element 35 mounted on the element mounting section 33a are covered with the dome-shaped transparent resin 36, and the light reflective resin layer 48 is formed on the top surface of the transparent resin 36, almost the whole of which is further sealed with the sealing resin 37, with end sections of the lead frames 32, 33 and 40 to 42 left unsealed.

Since the transparent resin 36 is a medium through which an optical signal emitted from the light emitting element 34 passes, it is formed of a silicone resin, rubber, or the like which is transparent or having light transmittance properties. Further, the transparent resin 36 is formed in dome shape of almost hemispherical shape to semi-ellipsoidal shape. It is to be noted that the transparent resin 36 is slightly formed also on the rear surfaces of the element mounting sections 32a, 33a.

Since an interface of the transparent resin 36 and the light reflective resin layer 48 is a light reflective curved surface for reflecting an optical signal, the light reflective resin layer 48 covering the top surface of the transparent resin 36 is formed of a material suitable for reflection of an optical signal. For instance, a colored resin having a high reflectivity (mainly, a white resin filled with a material having a good reflectivity, such as titanium oxide) may be used. Further, the light reflective resin layer 48 may be formed of a transparent resin having a smaller refractive index than that of the transparent resin 36, and an optical signal is reflected totally on the interface of the transparent resin 36 and the light reflective resin layer 48. As a material for the light reflective resin layer 48, a silicone resin, rubber, an epoxy resin or the like is employed.

The sealing resin 37 serves to protect (physically protect, chemically protect) the light emitting element 34, the light receiving element 35 and the like from external force, and is molded using an epoxy resin filled with silica. Further, when previously filling the sealing resin 37 with a material having a good reflectivity such as titanium oxide other than silica, an optical signal can be reflected on the sealing resin 37, and the transparent resin 36 can thus be omitted.

Therefore, according to the optical coupler 31 having such a structure, an electrical signal inputted from the lead frame 32 can be converted by the light emitting element 34 into an optical signal, and the optical signal can be launched from the light emitting element 34. The optical signal launched from the light emitting element 34 is reflected on the interface (light reflective curved surface) of the transparent resin 36, incident on the light receiving element 35, and received in each of the light receiving cells 46. The optical signal received in the light receiving element 35 is converted by the light receiving element 35 into an electrical signal, and the converted electrical signal is outputted from the lead frame 33.

Figure 7:
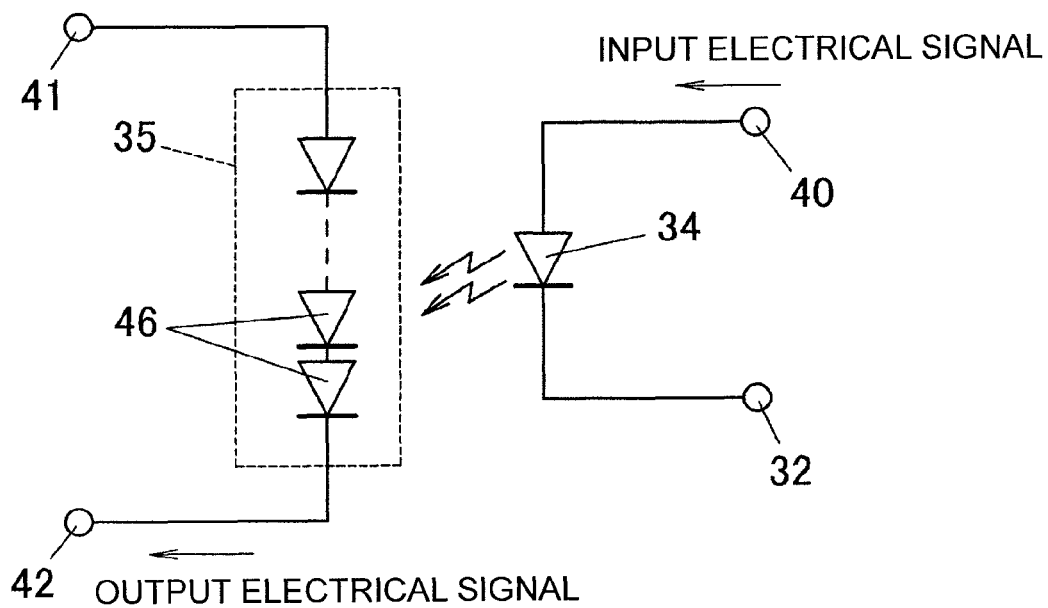
FIG. 7 is a diagram showing a circuit configuration of an optical coupler of the first embodiment.

Further, as shown in FIG. 7, with a plurality of light receiving cells 46 connected in series in the light receiving element 35, photoelectromotive force is generated by reception of an optical signal in each of the light receiving cells 46 so that large photoelectromotive force can be obtained in the light receiving element 35 as a whole. For instance, assuming that electromotive force of 0.5 to 0.6 V is generated in one light receiving cell 46, electromotive force of (0.5 to 0.6 V)×the number of rows of cells can be obtained the light receiving element 35 as a whole.

Figure 8A:
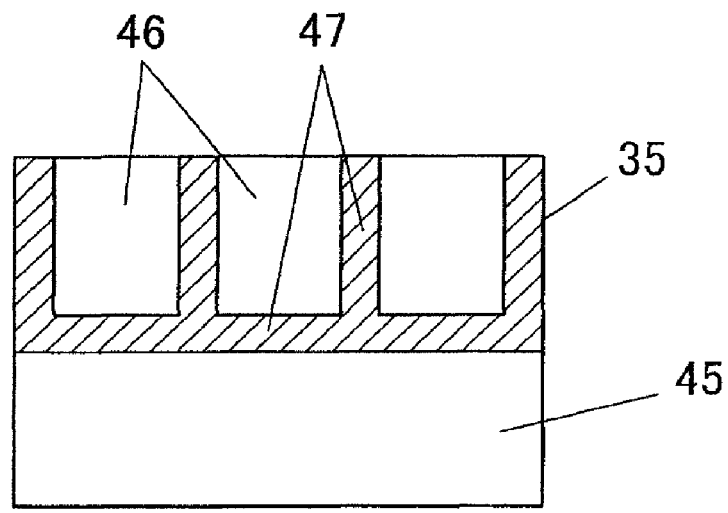
FIG. 8A is a schematic sectional view showing part of a light receiving element.

Further, the light receiving element 35 has a cross sectional structure as shown in FIG. 8A. The light receiving element 35 is structured such that separation layers 47 made of an insulating matter, such as an oxide film, are formed on the substrate 45 made of polysilicon or the like, and on the separation layer 47, a plurality of light receiving cells 46 partitioned with the separation layers 47 are formed. The light receiving cell 46 is configured, for instance, of a photodiode of Si type, Ge type, InGaAs type or the like. Since the light receiving cell 46 has a different peak sensitivity depending upon the material, a suitable one may be selected in view of a light receiving peak wavelength or a component cost. Each of the light receiving cells 46 is connected in series by means of a metal wiring pattern (not shown) formed on the top surface of the light receiving element 35.

Figure 8B:
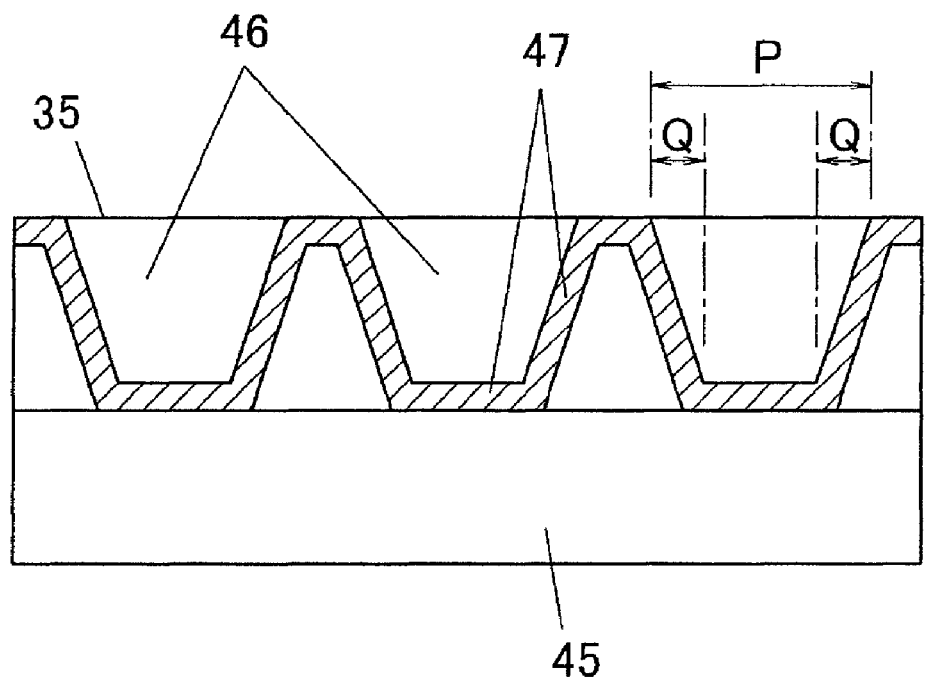
FIG. 8B is a schematic sectional view showing part of a light emitting element having another structure.

Moreover, in the light receiving element 35 shown in FIG. 8A, each of the light receiving cells 46 has an almost rectangular cross section. This is the case of using the separation layers 47 of an SOI (silicon on insulator) system. Connecting the plurality of light receiving cells 46 in series requires isolation of each of a light receiving cells 46, and systems for the isolation include a DI (dielectric isolation) system and the SOI system. In the case of the SOI system using an SOI wafer, the separation layers 47 can be vertically formed, and the light receiving cell 46 thus has a rectangular cross section. As opposed to this, in the case of the DI system, the separation layers 47 on the side surface are inclined as shown in FIG. 8B, and hence the light receiving cell 46 has a substantially V-shaped cross section.

In the DI system, with the light receiving cells 46 having the substantially V-shaped cross section, both side sections of the light receiving cell 46 (inclined areas indicated with Q in FIG. 8B) have small depths, and in these areas, the light receiving cells 46 has poor efficiency. In the case of the DI system, when a width P of the light receiving cell 46 is excessively narrowed, a rate of the inclined area Q increases, leading to deterioration in efficiency of the whole of the light receiving cells 46, and it is thus difficult to narrow the width of the light receiving cells 46. As opposed to this, in the SOI system, such an inclined area is hardly created and it is thus possible to narrow the width of the light receiving cells 46. When a plurality of light receiving cells 46 in rectangular shape are to be aligned in parallel as in the present embodiment, in the case of forming the same number of light receiving cells 46, the light receiving element 35 can be reduced more in size in the SOI system, and in the case of the light receiving element 35 having the same size, a larger number of light receiving cells 46 can be formed, and photoelectromotive force in the SOI system can be made larger. It is therefore desirable in the present embodiment to form the light receiving cells 46 so as to have a rectangular cross section by the SOI system.

(Manufacturing Process)

Next, the manufacturing process for the optical coupler 31 will be described.

(1) First, a hoop member made of a material excellent in electrical conductivity and thermal conductivity (e.g. copper base material, iron base material, or 42 alloy) is punched or etched, to form the lead frames 32, 33 and 40 to 42 in desired shapes, and the like. Subsequently, inner leads of the respective lead frames 32, 33 and 40 to 42 are subjected to such plating processing as to make wire bonding properties favorable (e.g. plating a Cu substrate with Ag, or plating an Ni/Pd substrate with Au), and thereafter the light emitting element 34 and the light receiving element 35 are mounted on the lead frames 32, 33 with a conductive adhesive (e.g. Ag paste, i.e. an epoxy resin containing Ag particles) or the like by means of an apparatus such as a die-bonder. In the case of the conductive adhesive, thermal curing is performed with an oven at a temperature of the order of 100 to 150° C. There are cases where the light receiving element 35 is bonded to (mounted on) the lead frame 33 by eutectic bonding.

(2) Subsequently, using a wire-bonder or the like, the wiring bond pad of the light emitting element 34 is wired with the lead frame 40 through the bonding wire 38. Further, the wiring pads 43, 44 of the light receiving element 35 are wired with the lead frames 41, 42 through the bonding wire 39. At this time, wire-bonding is performed while a temperature of the order of 180 to 250° C. is applied in order to enhance wire-bonding properties.

(3) In order to optically bond the light emitting element 34 and the light receiving element 35, the transparent resin 36, such as a silicone resin, rubber or an epoxy resin, in a fluid state with adjusted viscosity is applied using an apparatus such as a dispenser, to cover the light emitting element 34 and the light receiving element 35 so as to form a hemispherical shape or a semi-ellipsoidal shape. At this time, the transparent resin 36 has a viscosity of 1 to 10 pa·s, and in the case of using the silicone resin, the transparent resin 36 has a transparency of not smaller than 97% and a refractive index of the order of 1.4 to 1.6. In the case of the transparent resin 36 being a thermosetting resin, the transparent resin 36 is heated at a temperature of the order of 100 to 150° C. for the order of one to two hours for curing. For forming the transparent resin 36 into a stable hemispherical shape or semi-ellipsoidal shape, the whole may be vertically inverted such that the light emitting element 34 and the light receiving element 35 are located on the under surface sides of the lead frames 32, 33, and the transparent resin 36 may be thermally cured in the state of being hung downward.

(4) Subsequently, the surface of the transparent resin 36 is covered with the light reflective resin layer 48 made of a colored resin filled with particles of titanium oxide or the like and having reflectivity. Alternatively, the surface may be covered with a transparent resin having a lower refraction index (refraction index of the order of 1.2 to 1.4) than that of the transparent resin 36.

(5) Further, using a transfer molder, the outsides of the transparent resin 36 and the light reflective resin layer 48 are sealed with a thermosetting resin (epoxy resin), to mold the sealing resin 37. A molding temperature at this time is on the order of 160 to 180° C. For complete curing of the sealing resin 37, the sealing resin 37 is heated at a temperature of 100 to 150° C. for three to eight hours for after-curing.

(6) Thereafter, thick burrs between the sealing resin 37 and resin stoppers (tie bars) of the lead frames 32, 33 and 40 to 42, which were formed at the time of molding of the sealing resin 37, are punched out with a punch, to punch out the resin stoppers (tie bars) of the lead frames 32, 33 and 40 to 42. Further, thin burrs on the surfaces of the lead frames 32, 33 and 40 to 42, which were formed at the time of molding, are removed by electrolytic deburring or blasting.

(7) Subsequently, outer leads of the lead frames 32, 33 and 40 to 42 are subjected to external plating by plating or lead free plating.

(8) The lead frames 32, 33 and 40 to 42 are cut into predetermined lengths with a mold, which are then bent and cut off from the hoop member.

(9) Finally, the optical coupler 31 (product) is tested with a semiconductor tester or the like to discriminate between good and defective, and a defective product is extracted while a good product is packed in conformity to a form of a mounting machine. For instance, in the case of using a mounter for mounting, the optical coupler 31 is packed with a tape reel.

(Characteristics of the First Embodiment)

Figures 9A, 9B:
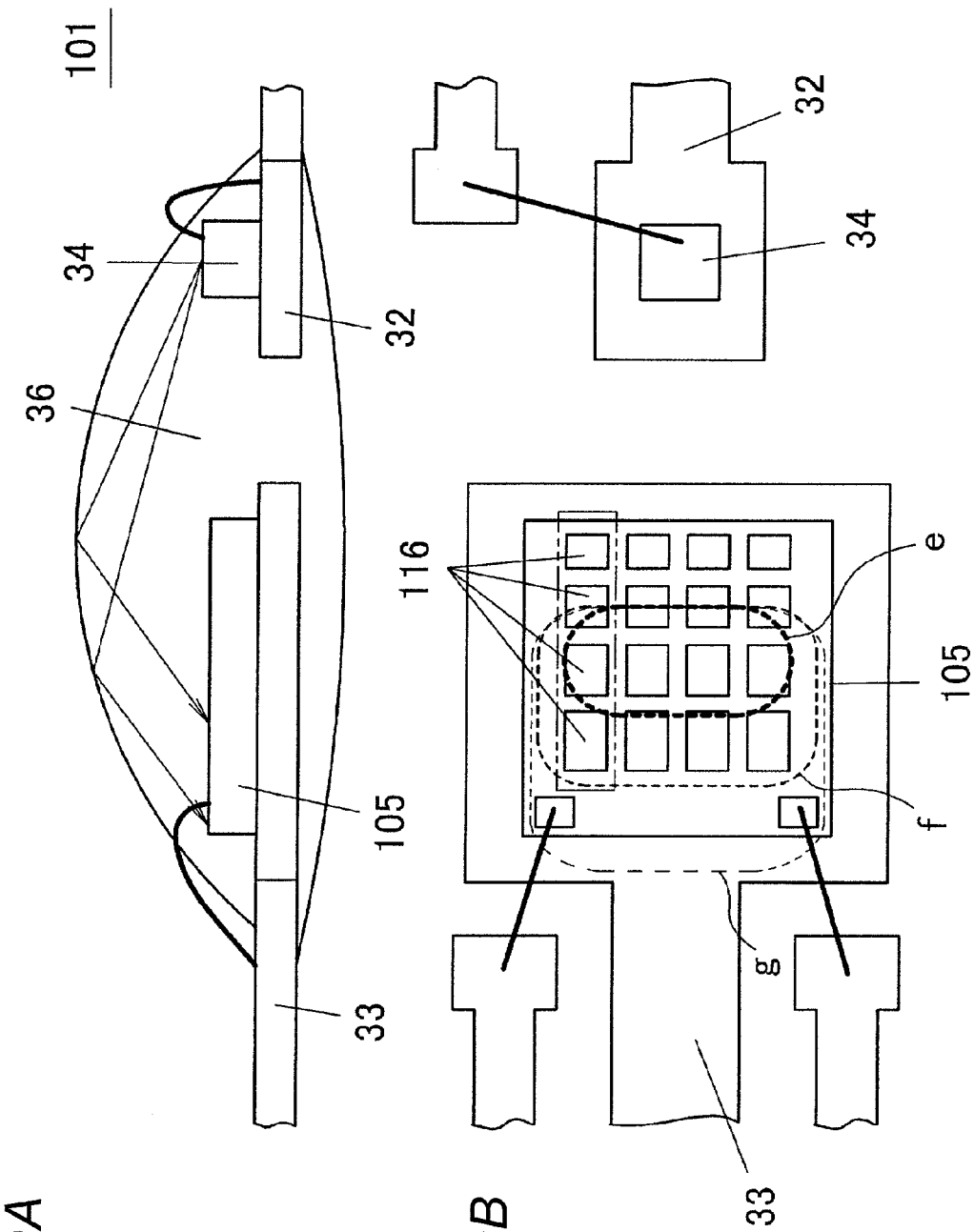
FIG. 9A is a sectional view showing an optical coupler of Comparative Example 2.
FIG. 9B is a plan view showing arrangement of a light emitting element and light receiving element thereof and a configuration of light receiving cells.

It was described that photoelectromotive force can be made larger according to the optical coupler 31 according to one or more embodiments of the present invention since the light receiving cells 46 are connected in series, and further, it will be described that a photocurrent generated in the light receiving element 35 can also be made larger by comparison with Comparative Example 2. FIGS. 9A and 10A are schematic sectional views each showing a principal part of an optical coupler 101 of Comparative Example 2, and FIGS. 9B and 10B are views each showing a distribution of light irradiation intensity in light receiving element 105 of the optical coupler 101. It is to be noted that dotted lines in FIG. 9B and FIG. 10B each indicate a distribution of light irradiation intensity by means of an optical signal: a thick dotted line "e" indicates an area having high light irradiation intensity; a thin dotted line "g" indicate an area having low light irradiation intensity; and a medium dotted line "f" indicates an area having medium light intensity.

Figure 1:
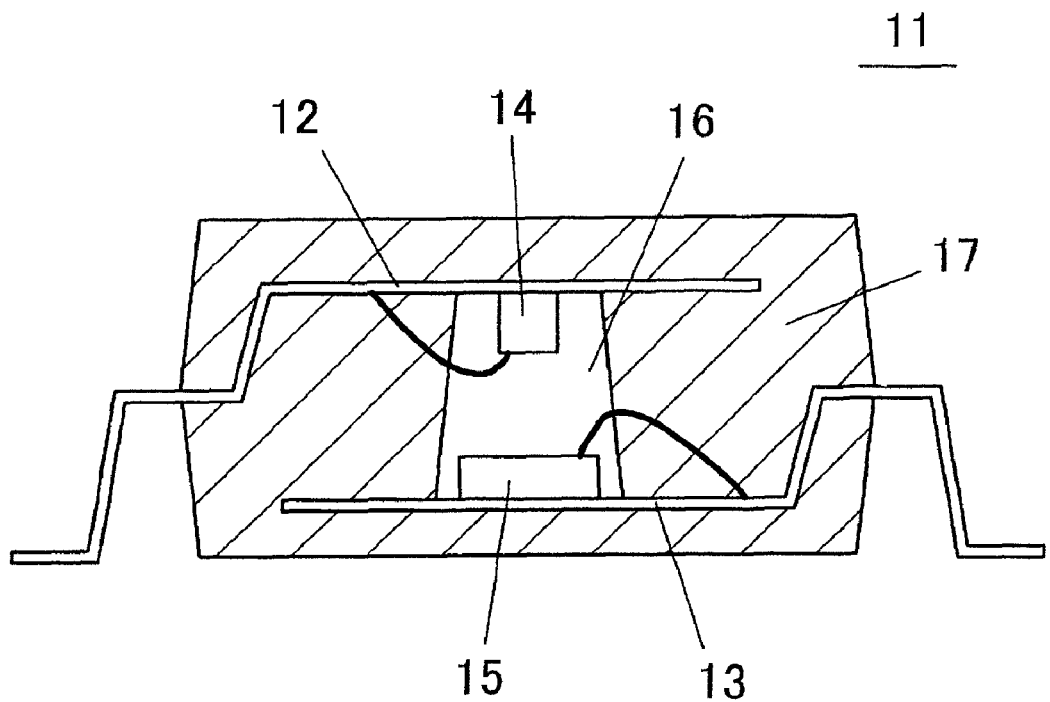
FIG. 1 is a sectional view showing a conventional opposed type optical coupler.
Figure 2:
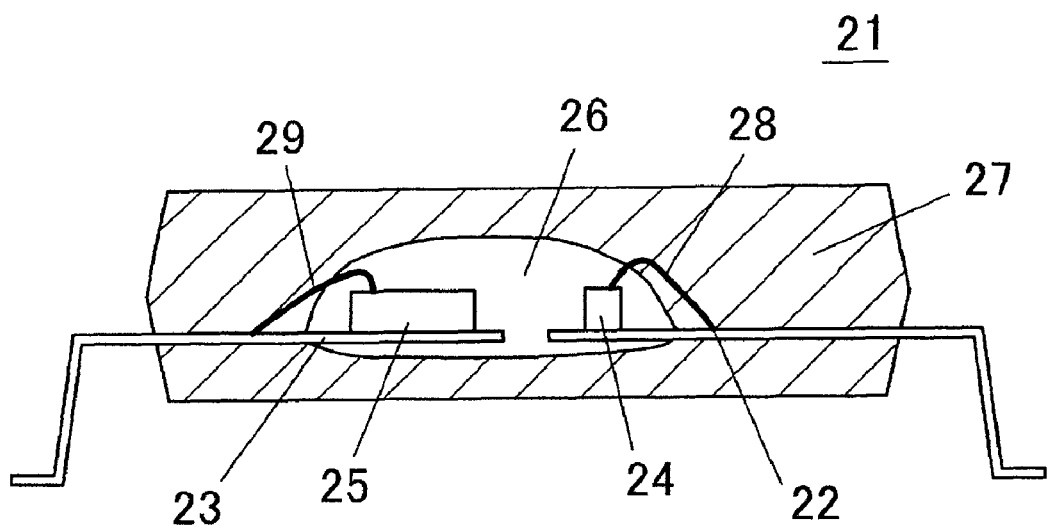
FIG. 2 is a sectional view showing a conventional juxtaposed type optical coupler.
Figure 3A:
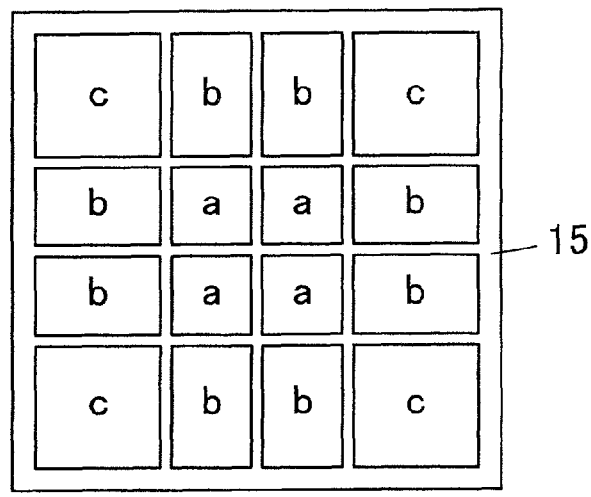
FIG. 3A is a plan view showing arrangement of light receiving cells used in the conventional opposed type optical coupler.
Figure 3B:
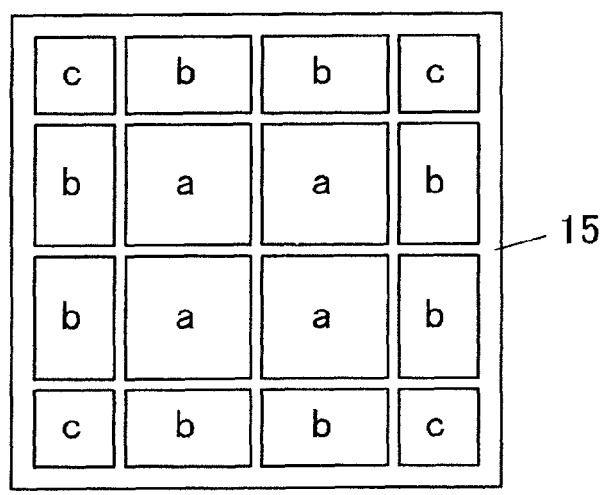
FIG. 3B is a plan view showing another arrangement of light receiving cells used in the conventional opposed type optical coupler.
Figure 3C:
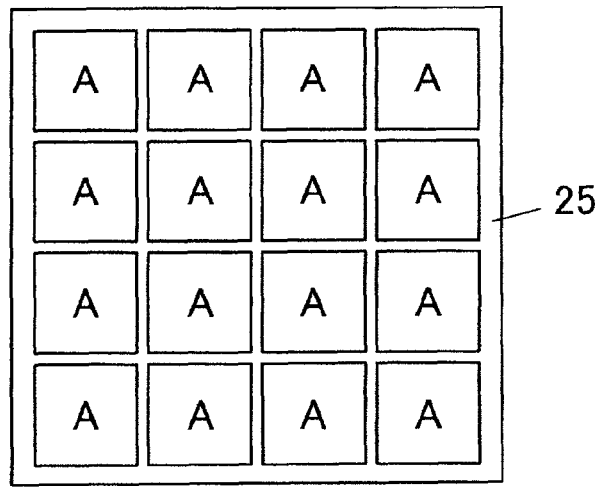
FIG. 3C is a plan view showing arrangement of light receiving cells used in the conventional juxtaposed type optical coupler.

In the conventional juxtaposed type optical coupler, the light receiving cells A having the same area were arrayed in matrix form as shown in FIG. 3C. However, in the case of the juxtaposed type optical coupler, among the light receiving areas of the light receiving element, the area closer to the optical signal has higher light irradiation intensity, and the area farther from the optical signal has lower light irradiation intensity. Therefore, when the technical thought having been applied to the opposed type optical coupler, as in Japanese Unexamined Patent Publication No. 3026396, is to be applied to the juxtaposed type optical coupler, an area of the light receiving cell 116 closer to the light emitting element 34 may be made smaller and an area of the light receiving cell 116 farther from the light emitting element 34 may be made larger, as shown in FIG. 9B or FIG. 10B.

As thus described, it is thought that in the optical coupler 101 of Comparative Example 2 where the light receiving cells 116 are arranged in matrix form such that the area of light receiving cell 116 gradually becomes larger in accordance with a distance from the light emitting element 34, the areas of the light receiving cells 116 have been optimized, thereby allowing generation of a large photocurrent larger, to enhance characteristics of the optical coupler 101.

However, in the transparent resin 36 made of a silicone resin, rubber or the like, a change over time in viscosity through a reaction of heat, light, a curing agent, or the like, a viscosity difference between a primary stage and a curing stage depending upon manufacturing lots, a difference in discharge rate caused by a difference in amount of the resin inside the dispenser, deformation caused by sealing with the sealing resin, or the like may occur, making it highly difficult to control the transparent resin 36 so as to have a desired dome shape, height and reflectivity. This makes it difficult to stabilize the shape of the light reflective curved surface.

In the juxtaposed type optical coupler, the light emitting element 34 and the light receiving element 105 are optically coupled through the light reflective curved surface, and thus come under the influences of occurrence of variations in shape of the transparent resin 36 (light reflective curved surface), variations in distance between the light emitting element 34 and the light receiving element 105, and the like. For instance, in a case where the transparent resin 36 becomes lower as in FIG. 9A due to a small amount of the transparent resin 36 applied or low viscosity of the transparent resin 36, an optical signal reflected on the light reflective curved surface reaches far. For this reason, as shown in FIG. 9B, the light irradiation intensity with an optical signal in the light receiving element 105 shifts to the farther side from the light emitting element 34. On the contrary, in a case where the transparent resin 36 becomes higher as in FIG. 10A due to a large amount of the transparent resin 36 applied or high viscosity of the transparent resin 36, an optical signal reflected on the element mounted section is not apt to reach far. For this reason, as shown in FIG. 10B, the light irradiation intensity with an optical signal in the light receiving element 105 shifts to the closer side to the light emitting element 34.

In the case of the light receiving element structure as in Comparative Example 2, when the distribution of the light irradiation intensity is displaced as thus described, an amount of light received in each of the light receiving cells 116 significantly varies, leading to large variations in photoelectromotive force and photocurrent of the light receiving element 105 and large variations in output characteristics thereof. Further, by making the whole of the light receiving cells 116 in one row (one set of the light receiving cells in one row is indicated as surrounded with a chain double-dashed line in FIG. 9B) long as compared with the spread of light receiving signals in the light receiving element 105, the amount of light received in the whole of the light receiving cells 116 in one row is not apt to change even when the distribution of light irradiation intensity is displaced. However, when one row is made longer in the light receiving cells 116 separated in matrix form, the light receiving cell 116 at the end hardly receives an optical signal and thus hardly generates a photocurrent, thereby causing the output current of the light receiving element 105 becoming extremely small. It should be noted that the above also applies to the conventional example as shown in FIG. 3C where the light receiving cells having the same area are arrayed in matrix form.

Figure 11A:
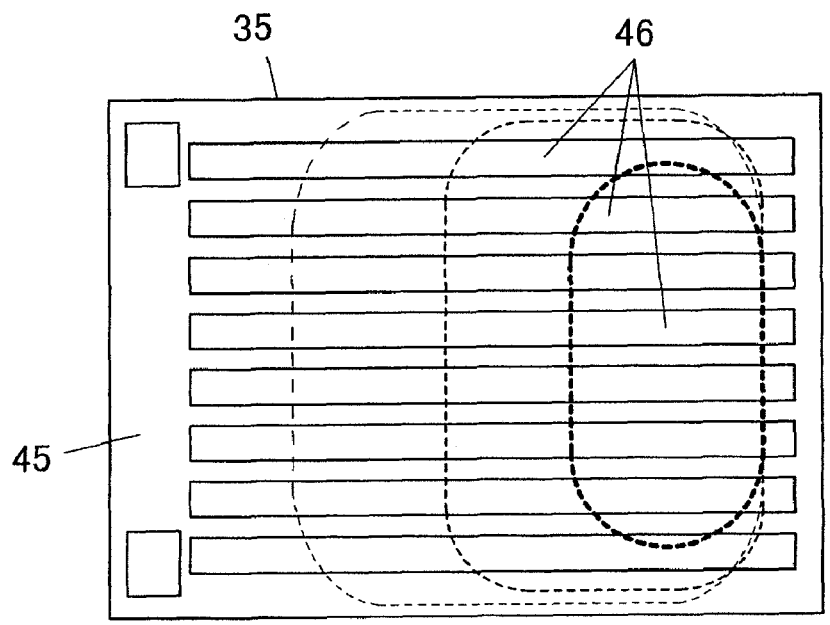
FIGS. 11A and 11B are action explanatory views of the optical coupler of the first embodiment.
Figure 11B:
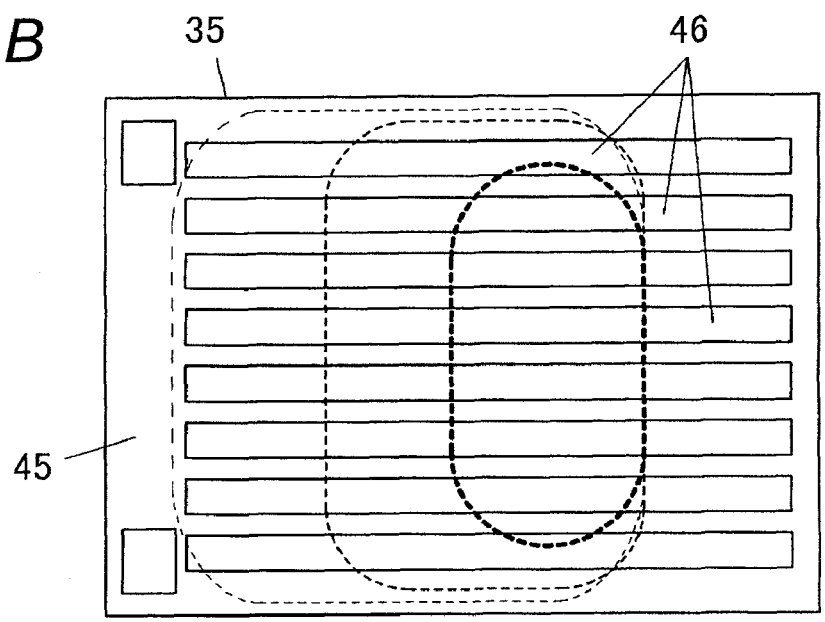

As opposed to this, in the optical coupler 31 of the present embodiment, when the light receiving cells 46 are sufficiently long as compared with an area with irradiated with an optical signal, even if a position irradiated with an optical signal is displaced as shown in FIGS. 11A and 11B due to variations in distance between the light emitting element 34 and the light receiving element 35 or variations in shape of the transparent resin 36, the optical signal is almost uniformly incident on each of the light receiving cells 46, and almost no change is made in amount of light received in each of the light receiving cells 46. This can not only increase electromotive force and an output current (photocurrent) of the light receiving element 35, but also stabilize the electromotive force and the output current, thereby to stabilize the characteristics of the optical coupler 31.

Figure 12:
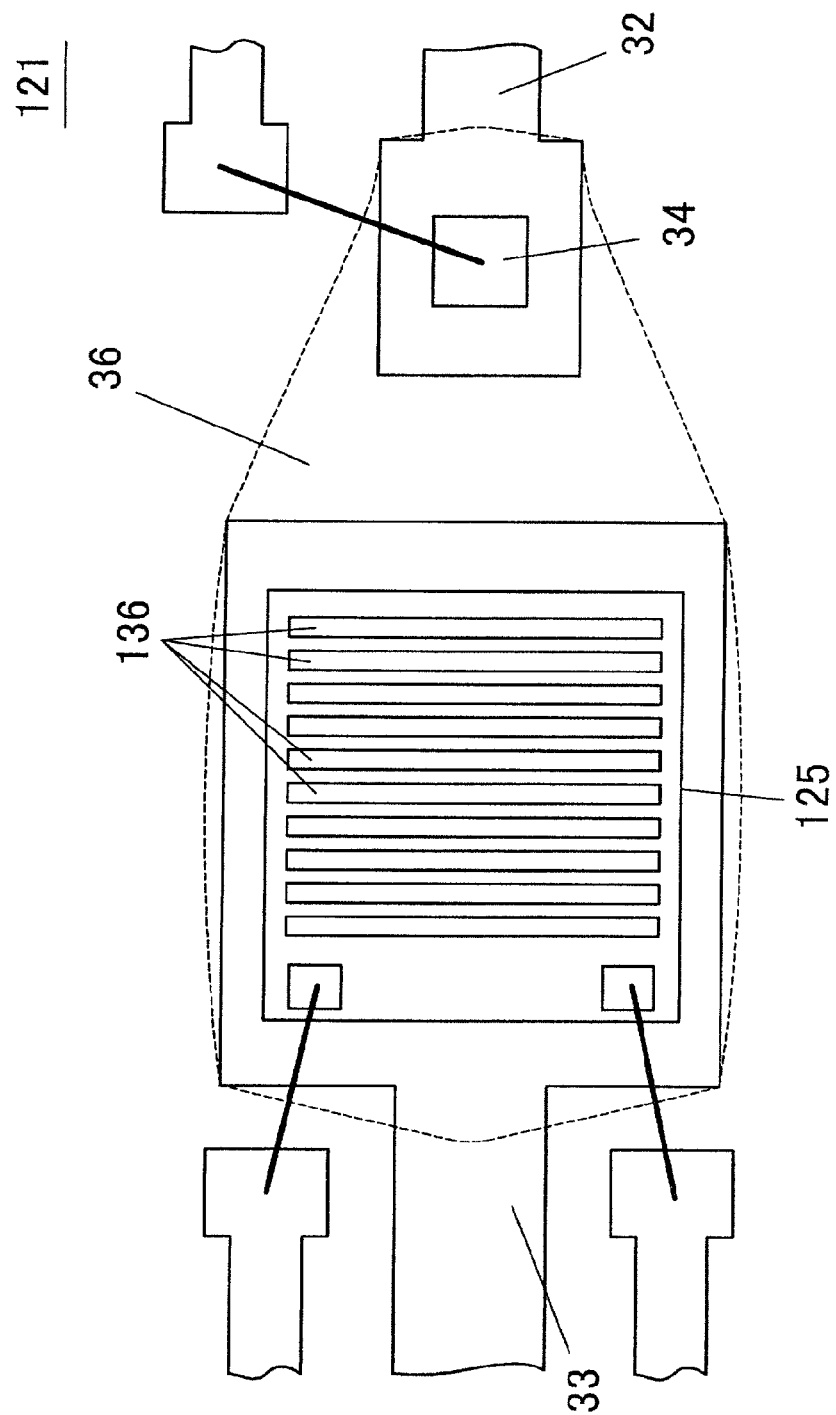
FIG. 12 is a schematic plan view showing Comparative Example 3.

Next, a result of studying the relation between an array direction of the light receiving cells 46 and efficiency of the optical coupler will be described. FIG. 12 represents an optical coupler 121 of Comparative Example 3 where a light receiving element 125 with a plurality of light receiving cells 136 arrayed in series is mounted such that the array direction of the light receiving cells 136 is almost in parallel with a direction connecting the light emitting element 34 and the light receiving element 125.

Figure 13:
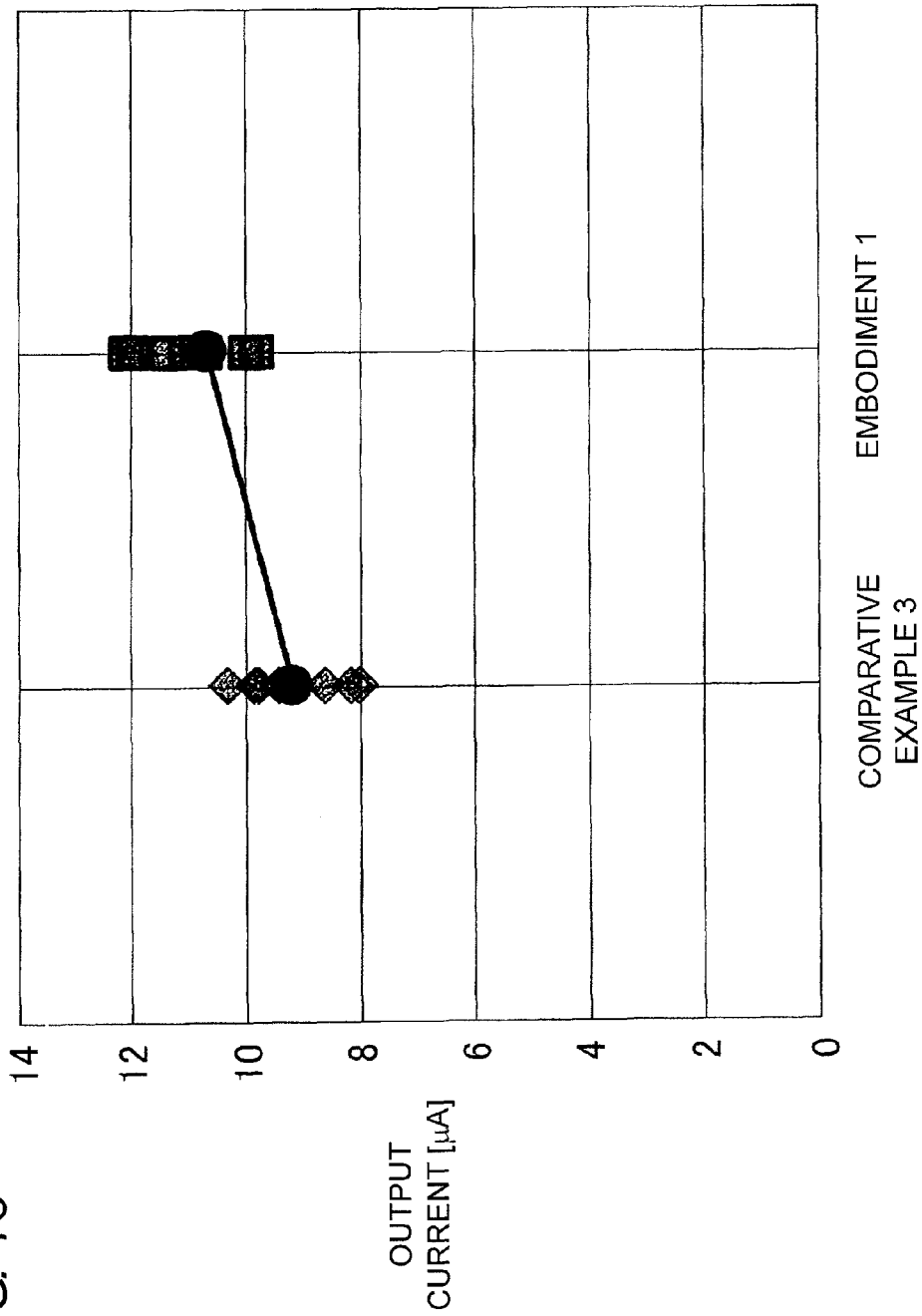
FIG. 13 is a diagram showing comparison between output current measurement values of a light receiving element of Comparative Example 3 and output current measurement values of the light receiving element of the first embodiment.

FIG. 13 represents results of producing a plurality of optical couplers 121 of Comparative Example 3 and a plurality of optical couplers 31 of the first embodiment, and measuring output currents of the respective optical couplers. Rhombus marks indicate measurement results of Comparative Example 3, square marks indicate measurement results of the first embodiment, and circular marks indicate average values of the respective measurement results. According to these measurement results, the output current (photocurrent) of the optical coupler 31 of the first embodiment is large by not smaller than 15% as compared with that of the optical coupler 121 of Comparative Example 3, which reveals that the output characteristics of the optical coupler can be enhanced according to the first embodiment of the present invention. Comparative Example 3 and the first embodiment have the same structure except for arrangement of the light receiving cells. Nevertheless, the optical coupler 31 of the first embodiment has a larger output current, and this is because a difference in amount of light of an optical signal incident on the light receiving cell 46 is small (each of the light receiving cells 46 almost evenly receives light) and a value of the smallest photocurrent among photocurrents generated in the respective light receiving cells 46 thus becomes large.

Figure 14:
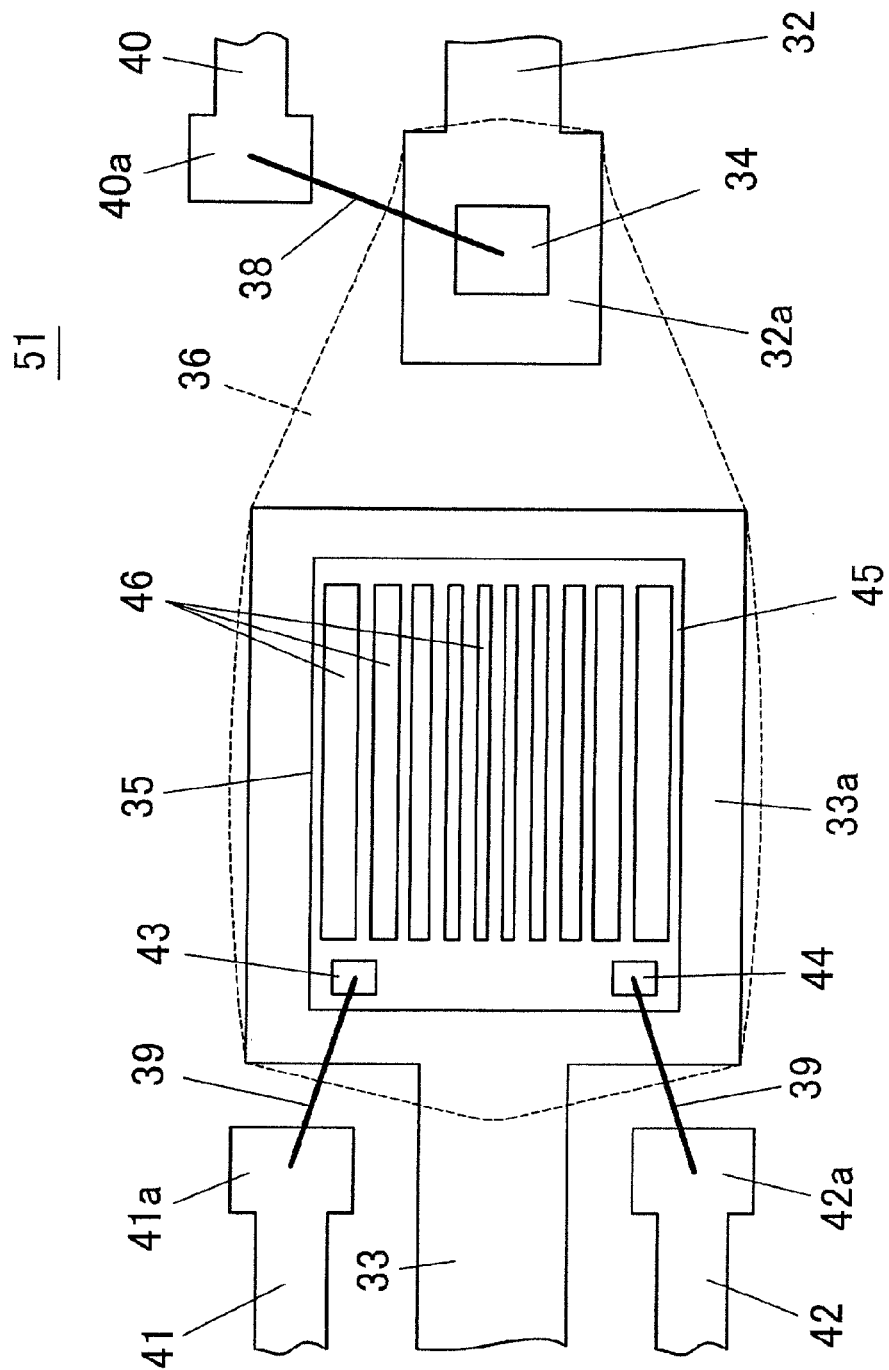
FIG. 14 is a schematic plan view of an optical coupler in accordance with a second embodiment of the present invention.

(Second Embodiment)
FIG. 14 is a plan view showing a structure of a principal part of an optical coupler 51 in accordance with a second embodiment of the present invention. Each of the light receiving cells 46 arrayed in parallel has an equivalent width in the optical coupler 31 of the first embodiment, whereas in the optical coupler 51, the width of the light receiving cell 46 at the midsection is narrowed and the width of the light receiving cell 46 at the end is widened. Other configurations are similar to those of the first embodiment, and descriptions thereof are thus omitted.

In the case of the light emitting element 34 being located almost on the central line of the light receiving area (whole of light receiving cells), an optical signal incident on the light receiving cell 46 at the center has larger light intensity than that of an optical signal incident on the light receiving cell 46 at each end. Therefore, in such a case, the width of the light receiving cell 46 at the center is reduced as appropriate (thus its area becomes smaller), and the width of the light receiving cell 46 at each end is widened as appropriate (thus its area becomes larger), so that the amount of light received in each of the light receiving cells 46 can be closer to uniformity. This can result in a larger output current of the optical coupler 51, to further enhance output characteristics.

Further, in the case of the light emitting element 34 being arranged in a position considerably far from the central line of the light receiving area, the width of each of the light receiving cells 46 can be dissymmetric with respect to the central line of the light receiving area. Moreover, depending upon a state of reflection of an optical signal on the light reflective resin layer 48, the width of the light receiving cell 46 at the midsection can be widened and the width of the light receiving cell 46 at each end can be narrowed.

Figure 15:
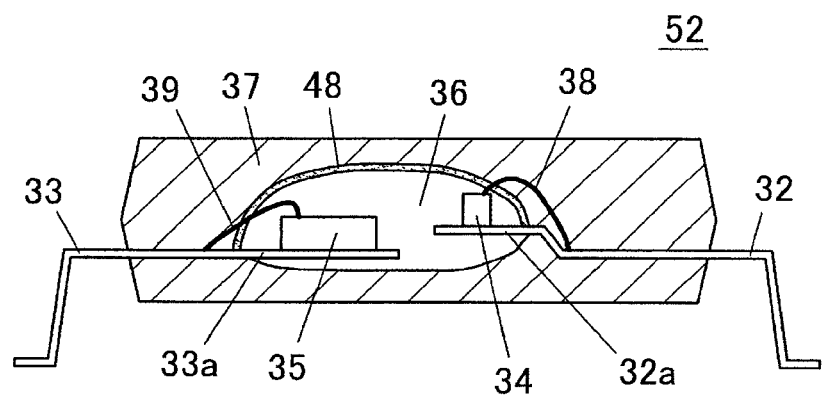
FIG. 15 is a sectional view of an optical coupler in accordance with a third embodiment of the present invention.

(Third Embodiment)
FIG. 15 is a sectional view showing an optical couple 52 in accordance with a third embodiment of the present invention. Also this optical coupler 52 is a juxtaposed type optical coupler since the light emitting element 34 and the light receiving element 35 are mounted on the surfaces of the same orientation in the element mounting sections 32a, 34a. Further, in this optical coupler 52, the element mounting section 32a mounted with the light emitting element 34 is higher than the element mounting section 33a mounted with the light receiving element 35.

Figure 16:
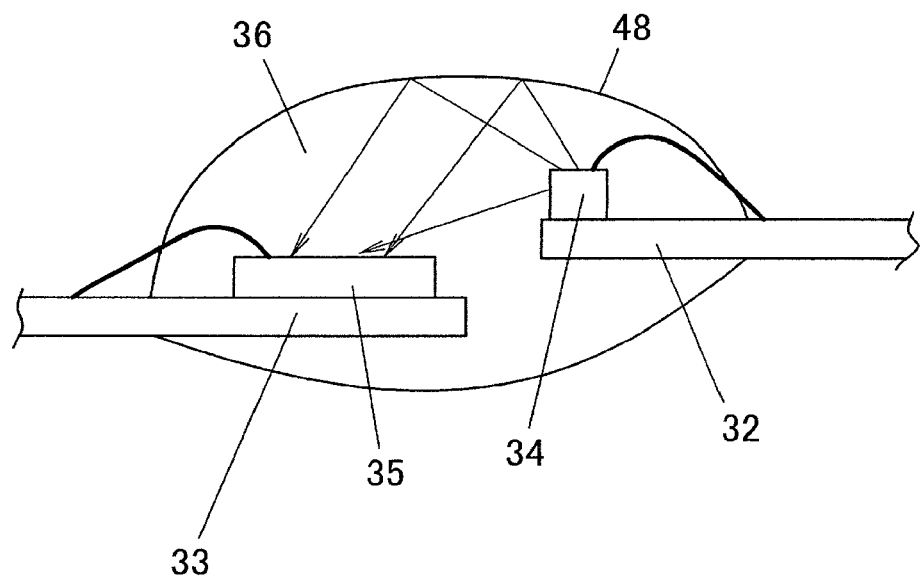
FIG. 16 is an action explanatory view of the optical coupler of the third embodiment.

As this optical coupler 52, when the position of the light emitting element 34 is higher than the position of the light receiving element 35, as indicated with an arrow line in FIG. 16, not only that light launched from the light emitting element 34 is reflected on the light reflective resin layer 48 and incident on the light receiving element 35, but also that part of the light launched from the light emitting element 34 is received in the light receiving element 35 without being reflected on the light reflective resin layer 48. This result in enhancement in optical coupling efficiency of the light emitting element 34 and the light receiving element 35, and output characteristics of the optical coupler 52 become more favorable.

Figure 17:
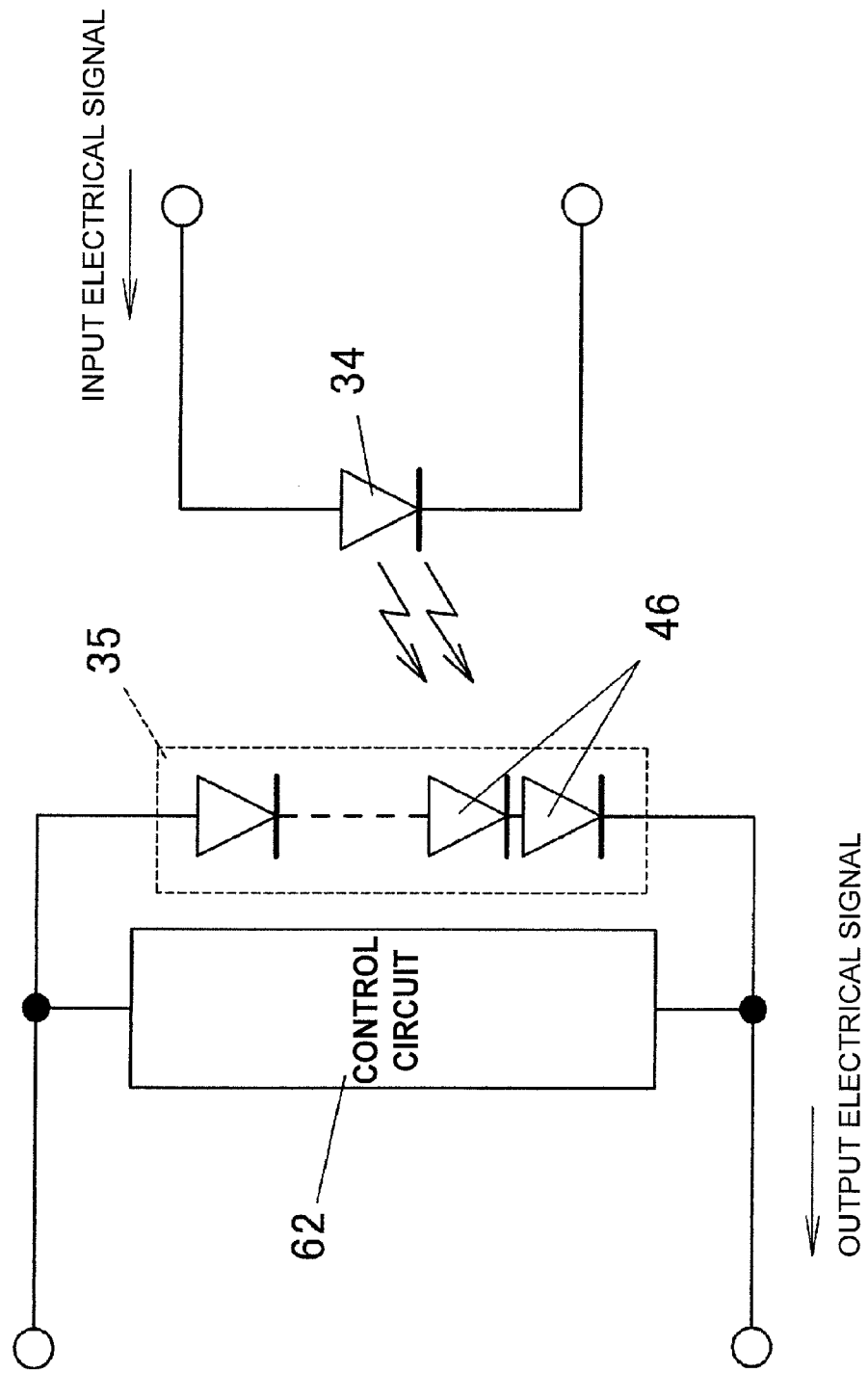
FIG. 17 is a diagram showing a circuit configuration of an MOS driver in accordance with a fourth embodiment of the present invention.

(Fourth Embodiment)
FIG. 17 is a plan view showing a circuit configuration of a MOS driver 61 in accordance with a fourth embodiment of the present invention. This MOS driver 61 is formed by connecting a control circuit 62 in parallel with the light receiving element 35 in the optical coupler 31 of the first embodiment. The control circuit 62 is not externally installed but sealed inside the sealing resin 37 along with the light emitting element 34 and the light receiving element 35.

This MOS deriver 61 is externally installed with MOSFETs on the output side (cf. FIG. 18), and gates of the MOSFETs are on (charge)/off (discharge) controlled. Further, the control circuit 62 serves to control a load connected to the output side of the MOS driver 61, and configured of a resistor, a transistor, and the like.

Figure 18:
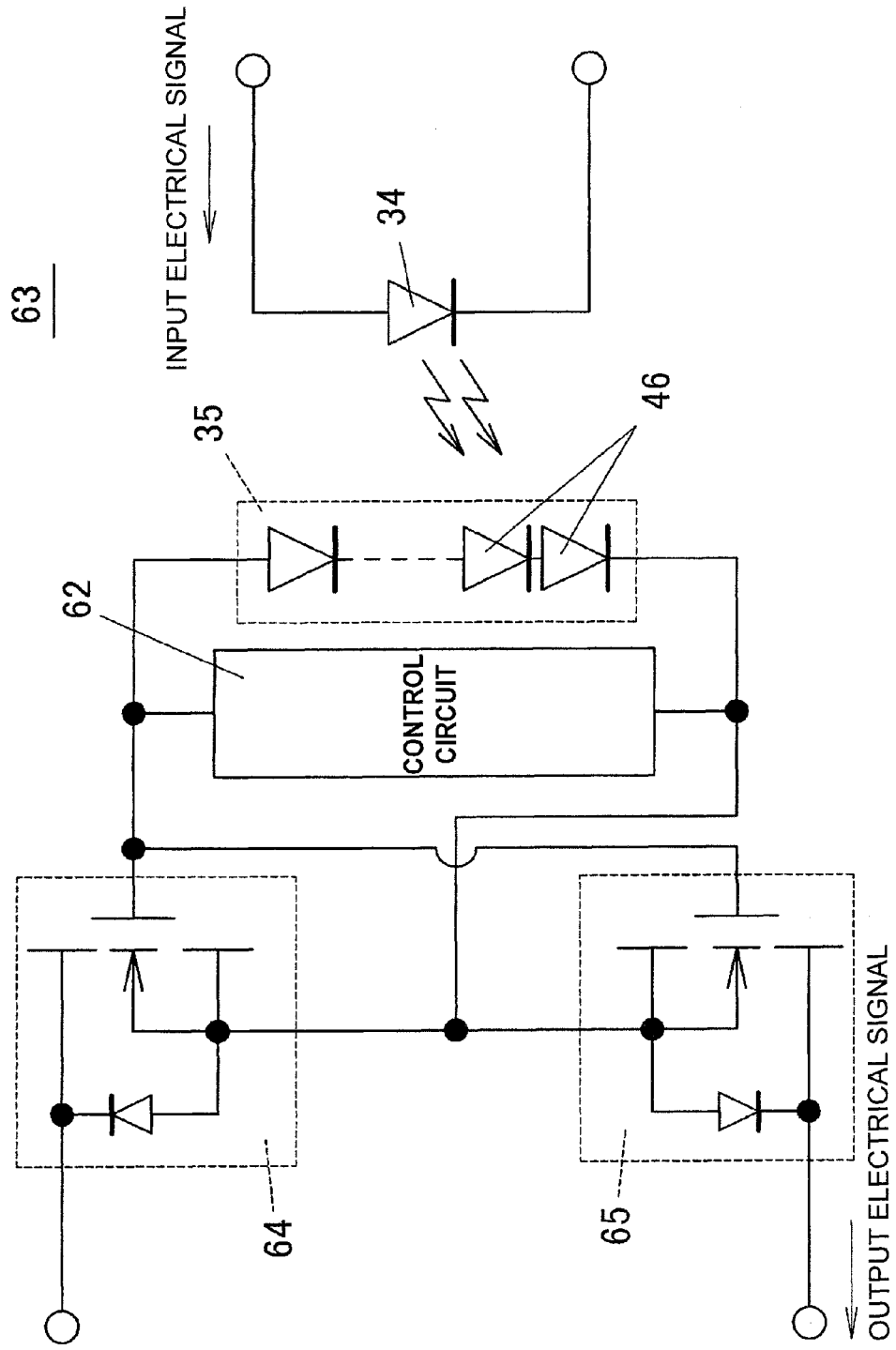
FIG. 18 is a diagram showing a circuit configuration of a semiconductor relay in accordance with a fifth embodiment of the present invention.

(Fifth Embodiment)
FIG. 18 is a plan view showing a structure of a principal part of a semiconductor relay 63 in accordance with a fifth embodiment of the present invention. This semiconductor relay 63 is formed such that in the MOS driver 61, gate electrodes of two MOSFETs 64, 65 are connected to one end (anode side) of the light receiving element 35, source electrodes of the respective MOSFETs 64, 65 are connected to the other end (cathode side) of the light receiving element 35, and drain electrodes of the MOSFETs 64, 65s are made to serve as output terminals of the semiconductor relay 63. The MOSFETs 64, 65 are not externally installed to the MOS driver 61, but sealed inside the sealing resin 37 along with the light emitting element 34, the light receiving element 35 and the control circuit 62.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An optical coupler comprising:
   a first terminal board and a second terminal board;
   a first conversion element for converting an electrical signal into an optical signal mounted on a surface of a first element mounting section of the first terminal board;
   a second conversion element for converting an optical signal into an electrical signal mounted on a surface of a second element mounting section of the second terminal board; and
   a light reflective curved surface formed so as to cover the first conversion element and the second conversion element,
   wherein the surfaces of the first element mounting section and the second element mounting section have the same orientation,
   wherein an optical signal emitted from the first conversion element is reflected on the light reflective curved surface, to optically couple the first conversion element and the second conversion element,
   wherein the second conversion element has a plurality of light receiving cells that are electrically connected in series, arrayed in parallel with one another, and longer in a longitudinal direction than in a width direction, and
   wherein the first conversion element is arranged inside an area sandwiched between two contact lines that are set so as to be in contact with an outline of the second conversion element, and are in parallel with a length direction of the light receiving cells, and
   wherein the first conversion element is disposed in the length direction of the light receiving cells with respect to the second conversion element.

2. An optical coupler comprising:
   a first terminal board and a second terminal board;
   a first conversion element for converting an electrical signal into an optical signal mounted on a surface of a first element mounting section of the first terminal board;
   a second conversion element for converting an optical signal into an electrical signal mounted on a surface of a second element mounting section of the second terminal board; and
   a light reflective curved surface formed so as to cover the first conversion element and the second conversion element,
   wherein the surfaces of the first element mounting section and the second element mounting section have the same orientation,
   wherein an optical signal emitted from the first conversion element is reflected on the light reflective curved surface, to optically couple the first conversion element and the second conversion element,
   wherein the second conversion element has a plurality of light receiving cells that are electrically connected in series, arrayed in parallel with one another, and longer in a longitudinal direction than in a width direction,
   wherein the first conversion element is arranged inside an area sandwiched between two contact lines that are set so as to be in contact with an outline of the second conversion element, and are in parallel with a length direction of the light receiving cells, and
   wherein among the light receiving cells arrayed in parallel with one another, the light receiving cell located at the midsection has a narrower width and the light receiving cell located at the end has a wider width.

3. A MOS driver comprising:
   an optical coupler comprising:
      a first terminal board and a second terminal board;
      a first conversion element for converting an electrical signal into an optical signal mounted on a surface of a first element mounting section of the first terminal board;
      a second conversion element for converting an optical signal into an electrical signal mounted on a surfaces of a second element mounting section of the second terminal board; and
      a light reflective curved surface formed so as to cover the first conversion element and the second conversion element,
   wherein the surfaces of the first element mounting section and the second element mounting section have the same orientation,
   wherein an optical signal emitted from the first conversion element is reflected on the light reflective curved surface, to optically couple the first conversion element and the second conversion element,
   wherein the second conversion element has a plurality of light receiving cells that are electrically connected in series, arrayed in parallel with one another, and longer in a longitudinal direction than in a width direction,
   wherein the first conversion element is arranged inside an area sandwiched between two contact lines that are set to be in contact with an outline of the second conversion element, and are in parallel with a length direction of the light receiving cells,
   wherein the first conversion element is disposed in the length direction of the light receiving cells with respect to the second conversion element, and
   wherein a control circuit for driving a MOSFET is connected in parallel with the second conversion element.

4. A semiconductor relay comprising:
   an optical coupler comprising:
      a first terminal board and a second terminal board;
      a first conversion element for converting an electrical signal into an optical signal mounted on a surface of a first element mounting section of the first terminal board;
      a second conversion element for converting an optical signal into an electrical signal mounted on a surfaces of a second element mounting section of the second terminal board; and
      a light reflective curved surface is formed so as to cover the first conversion element and the second conversion element,
   wherein the surfaces of the first element mounting section and the second element mounting section have the same orientation,
   wherein an optical signal emitted from the first conversion element is reflected on the light reflective curved surface, to optically couple the first conversion element and the second conversion element, wherein the second conversion element has a plurality of light receiving cells that are electrically connected in series, arrayed in parallel with one another, and longer in a longitudinal direction than in a width direction, wherein the first conversion element is arranged inside an area sandwiched between two contact lines that are set so as to be in contact with an outline of the second conversion element, and are in parallel with a length direction of the light receiving cells, wherein the first conversion element is disposed in the length direction of the light receiving cells with respect to the second conversion element, wherein a control circuit for driving a MOSFET is connected in parallel with the second conversion element, and wherein MOSFETs are respectively connected to both ends of the connection circuit.

* * * * *